United States Patent
June et al.

(10) Patent No.: US 8,807,204 B2
(45) Date of Patent: Aug. 19, 2014

(54) ELECTROHYDRODYNAMIC AIRFLOW ACROSS A HEAT SINK USING A NON-PLANAR ION EMITTER ARRAY

(75) Inventors: Michael S. June, Raleigh, NC (US); Chunjian Ni, Cary, NC (US); Dana S. Royer, Matthews, NC (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 1020 days.

(21) Appl. No.: 12/872,107

(22) Filed: Aug. 31, 2010

(65) Prior Publication Data

US 2012/0048529 A1    Mar. 1, 2012

(51) Int. Cl.
*F25B 29/00*    (2006.01)
*F28F 7/00*    (2006.01)
*F28D 15/00*    (2006.01)
*F28F 1/36*    (2006.01)

(52) U.S. Cl.
USPC .... 165/201; 165/80.2; 165/80.3; 165/104.33; 165/185; 361/690; 361/694; 361/703; 361/704; 361/709; 174/15.1; 174/16.1

(58) Field of Classification Search
USPC ............ 165/80.2, 80.3, 104.19, 104.33; 361/690, 694, 703, 704, 709, 710; 700/299, 300, 304; 174/15.1, 16.1
See application file for complete search history.

(56) References Cited

U.S. PATENT DOCUMENTS

| | | | |
|---|---|---|---|
| 4,231,766 A * | 11/1980 | Spurgin | 96/79 |
| 6,522,536 B2 | 2/2003 | Brewer et al. | |
| 6,603,268 B2 * | 8/2003 | Lee | 315/111.01 |
| 7,190,587 B2 | 3/2007 | Kim et al. | |
| 7,517,504 B2 * | 4/2009 | Taylor | 422/186.04 |
| 7,545,640 B2 * | 6/2009 | Fisher et al. | 361/694 |
| 7,661,468 B2 | 2/2010 | Schlitz | |
| 7,839,634 B2 * | 11/2010 | Ouyang | 361/691 |
| 2003/0090209 A1 | 5/2003 | Krichtafovitch et al. | |
| 2003/0209420 A1 * | 11/2003 | Taylor et al. | 204/164 |
| 2005/0007726 A1 | 1/2005 | Schlitz et al. | |
| 2006/0018809 A1 * | 1/2006 | Taylor et al. | 422/186.04 |

(Continued)

OTHER PUBLICATIONS

Li et al., "EHD Enhanced Heat Transfer with Needle-Arrayed Electrodes", National Tsing Hua University, 23rd IEEE SEMI-THERM Symposium, 2007, 6 pages.
Garimella et al., "On-Chip Thermal Management With Microchannel Heat Sinks and Integrated Micropumps", Proceedings fo the IEEE, vol. 94, No. 8, Aug. 2006, pp. 1534-1548.
N. E. Jewell-Larsen, Electrohydrodynamic (EHD) Cooled Laptop, TESSERA, Mar. 2009, pp. 1-21.

(Continued)

*Primary Examiner* — Brandon M Rosati
*Assistant Examiner* — Claire Rojohn, III
(74) *Attorney, Agent, or Firm* — Thomas E. Tyson; Jeffrey L. Streets

(57) ABSTRACT

A system for cooling a heat generating device comprises a heat sink and a plurality of ion emitter elements that form an electrohydrodynamic (EHD) air flow device. The heat sink has a base disposed in thermal communication with a heat generating device, such as a processor. A plurality of heat sink fins is coupled to electrical ground to form ion collectors. Ion emitter elements are disposed in a non-planar pattern along first ends of the plurality of fins so that each ion emitter element is equidistant from the first end of a nearest fin. A power supply applies an electrical potential between the plurality of ion emitter elements and the plurality of fins to induce a flow of ions that cause airflow across the heat sink. It is preferable to have at least three ion emitter elements that are equidistant from each fin of the heat sink.

11 Claims, 6 Drawing Sheets

(56) References Cited

U.S. PATENT DOCUMENTS

| | | |
|---|---|---|
| 2006/0169441 A1* | 8/2006 | Schlitz .......................... 165/121 |
| 2007/0140931 A1* | 6/2007 | Huang et al. ............. 422/186.04 |
| 2008/0060794 A1 | 3/2008 | Wei |
| 2008/0302510 A1* | 12/2008 | Ouyang ....................... 165/80.3 |
| 2008/0302514 A1* | 12/2008 | Ouyang ................... 165/104.33 |

OTHER PUBLICATIONS

Chau et al., "Study on the Cooling Enhancement of LED Heat Sources via an Electrohydrodynamic Approach", The 33rd Annual Conference of the IEEE Industrial Electronics Society (IECON), Nov. 5-8, 2007, Taipei, Taiwan, pp. 2934-2937.

* cited by examiner

ELECTROHYDRODYNAMIC AIRFLOW ACROSS A HEAT SINK USING A NON-PLANAR ION EMITTER ARRAY

BACKGROUND

1. Field of the Invention

The present invention relates to the control of airflow across the fins of a heat sink to cool an electronic component, such as a central processor unit (CPU).

2. Background of the Related Art

Computer systems include numerous components that use electrical energy and produce heat as a byproduct. Typically, these components are organized in a housing or chassis for efficient placement, storage and operation. In large computer systems, these individual chassis may be further organized into a rack-based computer system that enables many rack-mounted components to be operated in a high-density arrangement, which can produce a considerable amount of heat. However, each individual chassis may have its own unique cooling requirements that may change over time with varying workload.

Heat produced by the components within the chassis must be removed to control internal component temperatures and to maintain system reliability, performance, and longevity. In a conventional rack-based computer system, rack-mounted fans move cool air through the rack to cool the components. Standalone chassis may have their own dedicated fans. However, air moving through the chassis will tend to take the path of least resistance and it becomes necessary to consider air flow impedance between and among components and groups of components within a chassis. In order to achieve adequate airflow to each component without excessive operation of the fans, system designers will position and orient components within the chassis with due consideration to the need for adequate airflow.

Supporting ever-increasing processor power in ultra-dense systems with the lowest amount of energy expenditure is a continual challenge for system designers. A processor can produce a great deal of heat during heavy usage. Accordingly, a large heat sink is typically secured in direct thermal communication over the processor. The heat sink has fins that extend away from the processor into the path of airflow through the chassis and generally comprise a group of fins that are oriented parallel to the airflow direction.

In any given chassis design, the component layout and operation may be tested to assure adequate airflow to each component. Still, there is a desire to avoid excessive use of fans, since fan operation can consume a significant amount of power. It is desirable, therefore, to generate and use airflow efficiently and effectively. This objective is complicated by the dynamic nature of workloads, and thus heat production, among the chassis components.

BRIEF SUMMARY

One embodiment of the present invention provides a system, comprising a heat sink and a plurality of ion emitter elements that form an electrohydrodynamic (EHD) air flow device. The heat sink is disposed in thermal communication with a heat generating device, wherein the heat sink includes a plurality of fins that are coupled to ground to form ion collectors, each fin extending in a longitudinal direction from a first end to a second end. The ion emitter elements are disposed in a non-planar pattern along the first ends of the plurality of fins so that each ion emitter element is equidistant from the first end of a nearest fin. The plurality of ion emitter elements are coupled to a power source for applying an electrical potential between the plurality of ion emitter elements and the plurality of fins.

Another embodiment of the invention provides a method of inducing air flow across a heat sink, comprising positioning a base of an electronically conductive heat sink in thermal communication with a heat generating device, wherein the heat sink includes a plurality of fins; coupling the heat sink to ground; and emitting ions at three or more points that are equidistant from each one of the plurality of fins.

DETAILED DESCRIPTION

Figure 1:
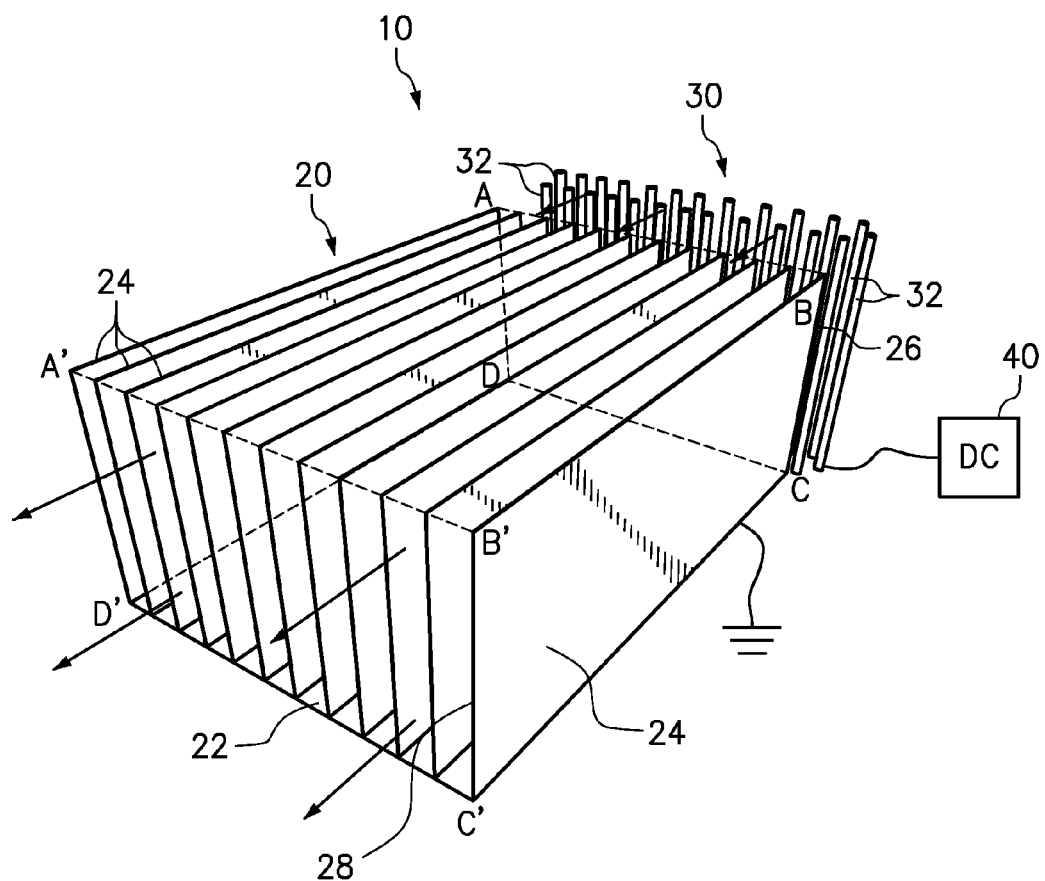
FIG. 1 is a perspective view of an electrohydrodynamic device including a heat sink and a plurality of ion emitter elements for inducing air flow across the heat sink.

One embodiment of the present invention provides a system for cooling a heat generating device. The system comprises a heat sink and a plurality of ion emitter elements that form an electrohydrodynamic (EHD) air flow device. The heat sink has a base disposed in thermal communication with a heat generating device, such as a processor. A plurality of fins are connected to the base of the heat sink for conduction of heat into the fins and coupled to electrical ground to form ion collectors. Each fin extends in a longitudinal direction from a first end to a second end, and the ion emitter elements are disposed in a non-planar pattern along the first ends of the plurality of fins so that each ion emitter element is equidistant from the first end of a nearest fin. The plurality of ion emitter elements are coupled to a power source for applying an electrical potential between the plurality of ion emitter elements and the plurality of fins.

Another embodiment of the invention provides at least three ion emitter elements that are equidistant from the first end of one or more of the plurality of fins. It is preferable to have at least three ion emitter elements that are equidistant from each fin of the heat sink. Optionally, the at least three ion emitter elements lie in an arc about the first end of each fin, wherein the arc is defined by a central angle of less than 30 degrees.

In a further embodiment, the distance between each ion emitter element and a nearest fin is from 10 to 25 millimeters. It is also desirable that the each of the plurality of fins is spaced apart by a distance greater than 6 millimeters.

In another embodiment, the plurality of ion emitter elements is secured to the heat sink by an electrically insulative member. Although the ion emitter elements may be secured directly to the motherboard or other structure within the chassis, the distance between the ion emitter elements and the heat sink fins is most consistently and accurately established by securing the ion emitter elements directly to the heat sink. Furthermore, this arrangement may avoid consuming valuable real estate on the motherboard and may be implemented without redesigning the motherboard. Using an insulative member, such as a plastic or ceramic material, maintains the desired electrical potential between the ion emitter elements and the heat sink. Optionally, the insulative member may be configured so that the distance between the plurality of ion emitter elements and the plurality of fins is adjustable. For example, the insulative member may include a pair of clips that frictionally engage with a pair of the fins at any point along the length of the fins.

In a still further embodiment, the system may further comprise a controller for controlling the electrical potential between the ion emitter elements and the heat sink fins to establish and/or vary a rate of airflow across the heat sink. Optionally, the controller is configured to selectively apply the electrical potential in response to a temperature of the heat generating device exceeding a temperature set point. The controller may be a baseboard management controller (BMC). The temperature could be measured by a dedicated temperature sensor positioned on the exterior of the heat sink or heat generating device. Where the heat generating device is a processor, the temperature of the processor can be communicated to the controller from the temperature sensor within the processor.

The ion emitter elements may take various forms and configurations. In a first option, each ion emitter element is a thin metal wire having little to no taper or a needle having a tapered end. For example, each ion emitter element may extend parallel to a straight edge formed at the first end of a nearest fin. Alternatively, the ion emitter element may be disposed at an angle relative to the fin serving as the ion collector. More generally, an EHD device of the present invention may comprise a high curvature element for emitting ions, such as the tip of a needle or a thin wire, and a blunt element for collecting ions, such as a plate or fin.

As used herein, an "electrohydrodynamic" (EHD) device is an apparatus that produces a flow of ionized particles (i.e., "ions") through air. An electrohydrodynamic device may sometimes be referred to by other terms, such as an "electrostatic" device or an "ionic airflow" device.

Another embodiment of the invention provides a method of cooling a heat generating device, comprising positioning a base of an electronically conductive heat sink in thermal communication with the heat generating device, wherein the heat sink includes a plurality of fins; coupling the heat sink to ground; and emitting ions at three or more points that are equidistant from each one of the plurality of fins. Preferably, the ions are emitted from ion emitter elements disposed at each of the points.

In one embodiment of the method, the distance between the three or more points and a nearest fin is from 10 to 25 millimeters. Furthermore, the fins of the heat sink are preferably spaced apart by a distance greater than 6 millimeters.

Another embodiment of the method further comprises adjusting the distance between the ion emitter elements and the plurality of fins to optimize the efficient for generating airflow.

A further embodiment of the method comprises securing the plurality of ion emitter elements to the heat sink.

A still further embodiment of the method comprises selectively applying electrical potential between the ion emitter elements and the plurality of fins to establish and/or vary a rate of airflow across the fins.

In accordance with the present invention, it has been found that the efficiency of an EHD device is very sensitive to distance from the ion emitter to the ion collector (in this case, the heat sink fins). As little as 1.6 mm difference in distance can affect the static efficiency by as much as a multiple of 5.8. The present invention arranges the emitter elements so that each emitter element is at an optimal distance to the nearest heat sink fin (i.e., ion collector). Furthermore, increasing the number of emitters with respect to fins has been shown to increase performance.

A high electric potential, such as 8000V DC or greater, is applied between the emitter and collector leading to ionization of air around the emitter. The ions are then attracted to the ion collector and, in the process, transfer momentum to the adjacent air molecules resulting in airflow in a direction from the emitter to the collector. Where a nonionic air moving device has already established an airflow rate through the chassis in an airflow direction, the ionic movement of air may serve to enhance the airflow rate by positioning the ion emitter upstream of the collector electrode. It should be recognized that references to upstream or downstream positions are made with reference to the airflow direction established by the nonionic air moving device. Although the electrical potential is preferably 8000V DC or greater, the power input to the ionic device may be less than 20 W with the proper optimization.

FIG. 1 is a schematic perspective view of an electrohydrodynamic device 10 including a heat sink 20 and an array 30 of ion emitter elements 32 for inducing air to flow across the heat sink (as represented by the arrows). The heat sink 20 may be made of a thermally conductive to conduct heat from a heat generating device (not shown) that is thermal contact with the underneath side of the base 22 to the plurality of fins 24. Each of the fins 24 is generally planar and extends longitudinally from a first end 26 to a second end 28. In the preferred configuration shown, each end 26, 28 forms a straight edge that is perpendicular to the generally planar base 22. Furthermore, the first ends 26 of the plurality of fins 24 lie in a common plane ABCD, as more clearly shown by the second ends 28 of the plurality of fins 24 lying in the plane A'B'C'D'. In the construction of the heat sink 20, there may be no difference in the first and second ends. However, regardless of the orientation of the heat sink, the performance of the electrohydrodynamic device is determined by the geometry and materials of the ion emitter elements and the nearest end of the fins.

The ion emitter elements 32 are formed by electronically conductive wires or needles that extend generally parallel to the edges formed at the end 26 of the fins 24. Each of the ion emitter elements 32 are coupled, either directly or indirectly, to a direct current power supply 40 ("DC") to establish an electrical potential (DC voltage) between the ion emitter elements 32 and the ends 26 of the fins 24. The ion emitter elements and the fins are electronically isolated except for the flow of ions through the air.

Figure 2:
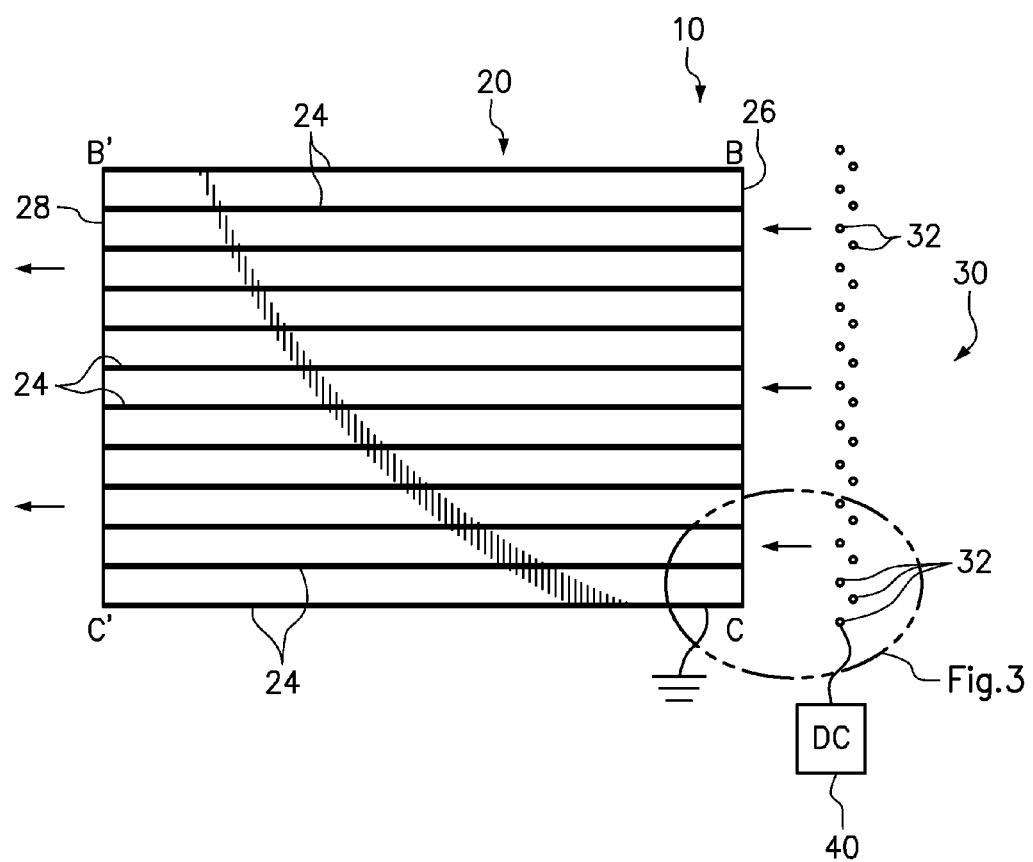
FIG. 2 is a plan view of the electrohydrodynamic device of FIG. 1 is a side view of the electrohydrodynamic device of FIG. 1.

FIG. 2 is a schematic plan view of the electrohydrodynamic device 10 of FIG. 1. As shown, the heat sink 20 has a plurality of fins 24 that extend longitudinally (left to right) from the first end 26 to the second end 28. The ion emitter array 30 is spaced apart from the heat sink 20 with the individual ion emitter elements 32 facing the ends 26 of each of the fins 24. Each of the ion emitter elements 32 is coupled to the DC power supply 40, although such connections are not shown. Applying electric potential between the ion emitter elements 32 and the fins 24 induces a flow of ions from the emitter elements 32 to the fins 24 (i.e., the ion collectors 24). It is this flow of ions that causes air to move in the same direction (as shown by the right-to-left arrows). The ions may be positive or negative ions depending upon whether the ion emitter elements are coupled to the positive or negative terminal of the DC power supply, respectively.

Figure 3:
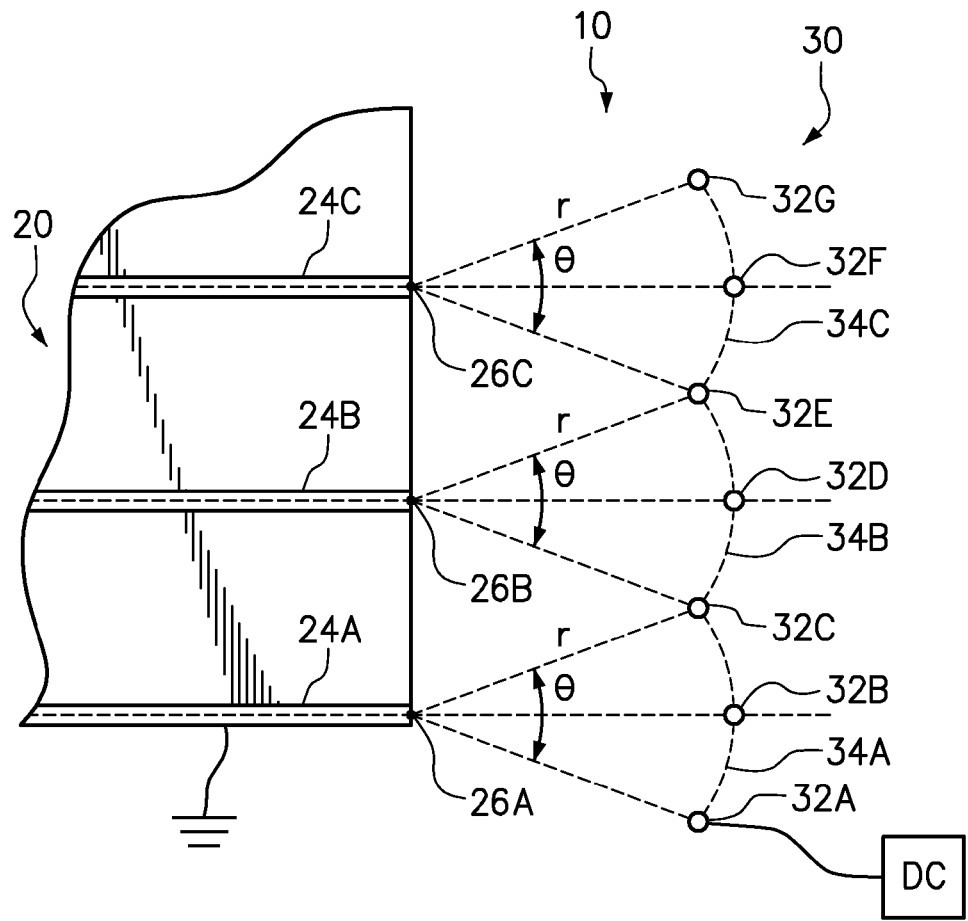
FIG. 3 is a partial plan view of the electrohydrodynamic device of FIG. 3 emphasizing the positioning of the ion emitter elements relative to the nearest fin of the heat sink.

FIG. 3 is a partial plan view of the electrohydrodynamic device 10 of FIG. 2 taken from the cut out section as shown in FIG. 2. FIG. 3 emphasizes the positioning of the ion emitter elements 32A-32G relative to the nearest of the fins 24A-24C. For example, the lower three ion emitter elements 32A, 32B, 32C that are an equal distance "r" from the end 26A of the fin 24A. Accordingly, the three ion emitter elements 32A, 32B, 32C are positioned along an arc 34A about a center point 26A at a radius of r and having a central angle of theta (θ) degrees. Similarly, the three ion emitter elements 32C, 32D, 32E are positioned along an arc 34B about a center point 26B at a radius of r and having a central angle of theta (θ) degrees, and the three ion emitter elements 32E, 32F, 32G are positioned along an arc 34C about a center point 26C at a radius of r and having a central angle of theta (θ) degrees. Therefore, each ion emitter element is equidistant from the first end of a nearest fin. It is recognized that the portion of the ion emitter array 30 shown in FIG. 3 has a first ion emitter 32C that is the same distance from two adjacent fins 24A, 24B, and a second ion emitter 32E that is also the same distance from two adjacent fins 24B, 24C.

Figure 4:
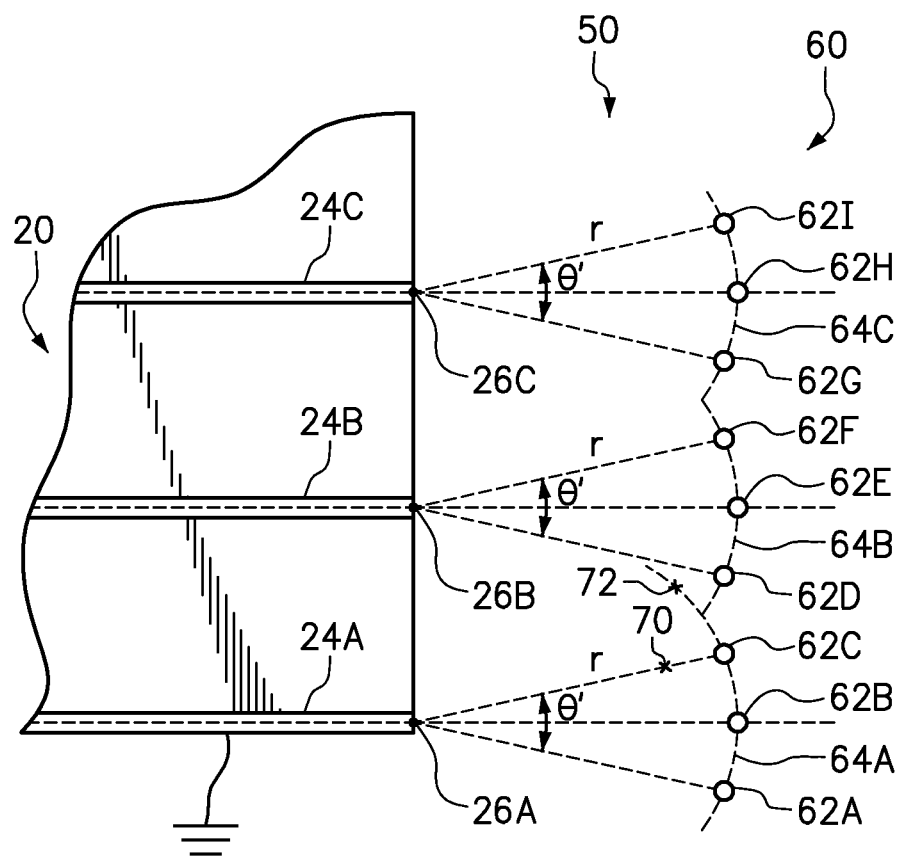
FIG. 4 is a partial plan view of an alternative embodiment of an electrohydrodynamic device emphasizing alternative positioning of ion emitter elements relative to the nearest fin of the heat sink.

FIG. 4 is a partial plan view of an alternative embodiment of an electrohydrodynamic device 50, showing only a portion of the device similar to that of FIG. 3. In the EHD device 50, an ion emitter array 60 includes three ion emitter elements 62A, 62B, 62C that are an equal distance "r" from the end 26A of the fin 24A. Accordingly, the three ion emitter elements 62A, 62B, 62C are positioned along an arc 64A about a center point 26A at a radius of r and having a central angle of theta prime (θ') degrees. The difference between the ion emitter elements in FIG. 3 and FIG. 4, is that the three ion emitter elements 62A, 62B, 62C in FIG. 4 are disposed along a shorter arc 64A (arc 64A is shorter than arc 34A in FIG. 3) that is defined by a smaller angle θ' (θ' is less than θ in FIG. 3). Accordingly, there are no ion emitter elements in FIG. 4 that are the same distance from two adjacent fins. For example, ion emitter element 62C is nearer to lower fin 24A than to adjacent fin 24B. Thus, it could be said that Similarly, the three ion emitter elements 62D, 62E, 62F are positioned along an arc 64B about a center point 26B at a radius of r and having a central angle of theta prime (θ') degrees, and the three ion emitter elements 62G, 62H, 62I are positioned along an arc 64C about a center point 26C at a radius of r and having a central angle of theta prime (θ') degrees. Therefore, each ion emitter element is equidistant from the first end of a nearest fin in both FIG. 3 and FIG. 4, but there are no ion emitter elements in FIG. 4 that are the same distance from two adjacent fins. Other arrangements of ion emitter elements can be envisioned with uneven spacing between ion emitter elements, different central angles from one fin to another, and different emitter to fin distances from one fin to another. Still, the ion emitting arrays of the present invention are in a configuration in which each of the ion emitter elements that are nearest to a particular fin should be the same distance from that fin.

In an example of an ion emitter array that would not follow the foregoing configuration, if the third ion emitter element 62C was moved inwardly to a new position 70, then it is still nearest to fin 24A, but the other two elements 62A, 62B are also nearest to fin 24A and those three elements 62A, 62B, 62C are not the same distance from the fin 24A. In a second example that would not follow the desired configuration, if the third ion emitter element 62C was moved upwardly along the arc 64A to a new position 72, it would then be nearest to fin 24B, but the other three elements 62D, 62E, 62F are also nearest to fin 24B and those four elements 62C, 62D, 62E, 62F are not the same distance from the fin 24A (even though element 62C is still the same distance from fin 24A).

Figure 5:
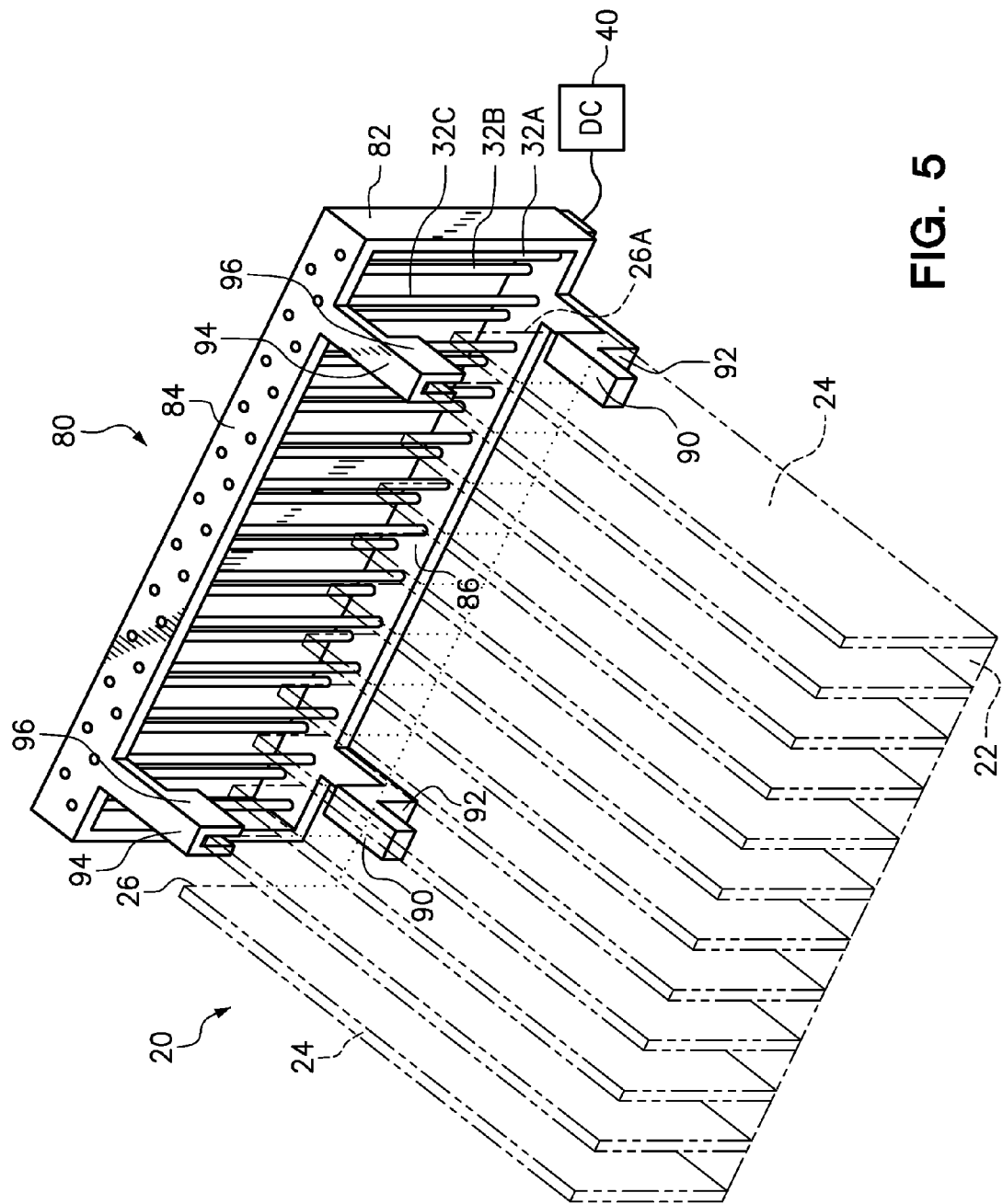
FIG. 5 is a perspective view of one embodiment of the ion emitter elements formed into an assembly for securing to the heat sink.

FIG. 5 is a perspective view of one embodiment of an assembly 80 for securing the ion emitter array 30 to the heat sink 20 (shown in phantom lines to more clearly show the assembly 80). The assembly 80 includes a frame 82 made from an electrically insulative material, such as plastic or ceramic. The ion emitter elements 32 of the array 30 are secured in their non-planar configuration between an upper frame member 84 and a lower frame member 86. The lower end of each ion emitter element 32 is connected to an electrically conductive plate 88 extending along the bottom surface of the lower frame member 86 for coupling to the DC power supply 40.

The frame 82 is itself secured to the heat sink 20 to establish a desired distance between the ion emitter elements 32 and the ends 26 of the fins 24. The lower frame member 86 includes a pair of brackets 90 that are each received between two adjacent fins 24 to sit on the base 22. A shoulder 92 or other feature of the bracket 90 may be pushed into contact with the end of the base 22 to establish the proper distance between the ion emitter elements 32 and the fins 24. The upper frame member 84 also includes a pair of brackets 94, preferably including a flexible clip 96 at the end of the brackets 94. The clip 96 should grip a corresponding fin 24 and secured the assembly 80 in position. Other assemblies, frames and/or brackets may be envisioned within the scope of the invention.

Figure 6:
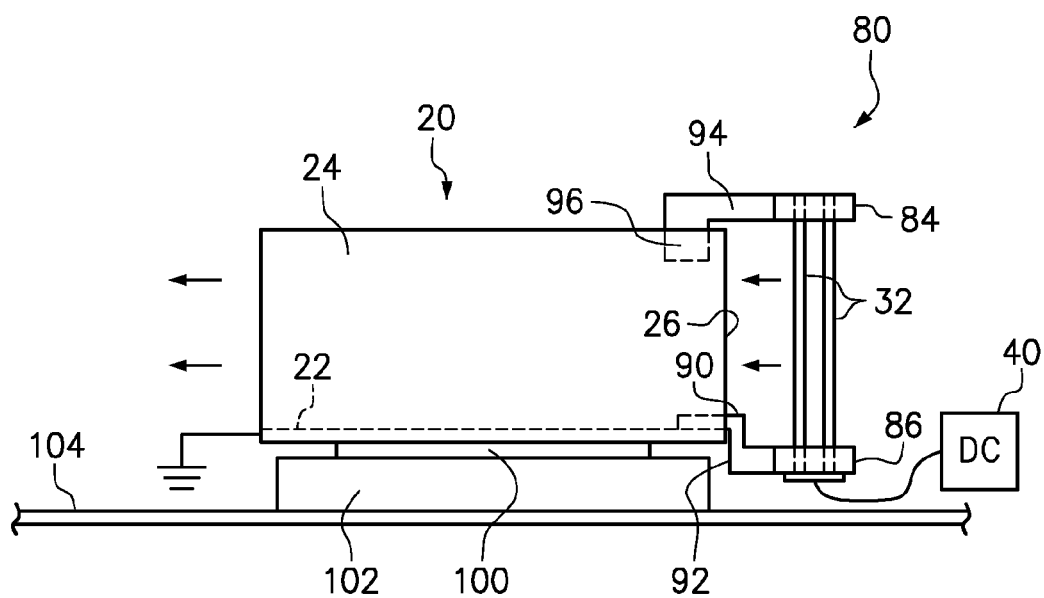
FIG. 6 is a side view of an electrohydrodynamic device including the assembly of FIG. 5.

FIG. 6 is a side view of an electrohydrodynamic device including the assembly 80 of FIG. 5. The assembly 80 is secured in position by the upper pair of brackets 94, which extend from the upper frame member 84, and by the lower pair of brackets 90, which extend from the lower frame member 86. The lower pair of brackets 90 rest on the heat sink base 22 with the shoulder 92 pushed against the base to establish the distance r between the ends 26 of the fins 24 and the ion emitter elements 32. The upper pair of brackets 94 includes clips 96 that fit over the top of a fin 24 and grip the side surfaces of the fin 24 to secure the assembly 80 in position relative to the heat sink 20. The brackets 90, 94 may slide along the fins and base to adjust the distance of the ion emitter elements from the fins over a small range.

In operation, the heat sink 20 is positioned in direct thermal communication with a processor 100 that is secured in a socket 102 on the motherboard 104. Heat generated by the processor 100 is conducted into the heat sink 20 and is spread from the base 22 to each of the plurality of fins 24. The DC power supply 40 applies an electrical potential between the ion emitter elements 32 and the end 26 of the fins 24. The electrical potential induces the formation of ions at the emitter elements 32 and the collection of those ions at the fins 24 which are coupled to ground potential. Movement of the ions from the emitters to the collectors causes a flow of air in the same direction (illustrated by the right-to-left arrows). This flow of air across the surfaces of the fins causes heat transfer from the fins into the air. Continual movement of cool air across the fins allows the processor to operate without its temperature reaching a level that could damage the processor or lead to unreliable performance.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to methods, apparatus (systems) and computer program products according to embodiments of the invention. It will be understood that aspects of performing the methods and controlling the apparatus can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the method.

These computer program instructions may also be stored in a computer readable medium that can direct a computer, other programmable data processing apparatus, or other devices to function in a particular manner, such that the instructions stored in the computer readable medium produce an article of manufacture including instructions which implement the method.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the method.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system, comprising:
a heat sink in thermal communication with a heat generating device, wherein the heat sink includes a plurality of fins coupled to ground to form a plurality of ion collectors, each fin extending in a longitudinal direction from a first end to a second end;
a plurality of ion emitter elements disposed in a non-planar pattern along the first ends of the plurality of fins, wherein the plurality of ion emitter elements are coupled to a power source for applying an electrical potential between the plurality of ion emitter elements and the plurality of fins, wherein each ion emitter element extends parallel to the first end of a nearest fin and is equidistant from the first end of the nearest fin, wherein at least three ion emitter elements are equidistant from the first end of the nearest fin and are positioned in an arc having an axis that extends along the first end of the nearest fin.

2. The system of claim 1, wherein the arc is defined by a central angle of less than 30 degrees.

3. The system of claim 1, wherein the distance between each ion emitter element and a nearest fin is from 10 to 25 millimeters.

4. The system of claim 1, wherein the plurality of fins are spaced apart by a distance greater than 6 millimeters.

5. The system of claim 1, wherein the plurality of ion emitter elements are secured to the heat sink by an electrically insulative member.

6. The system of claim 5, wherein the distance between the plurality of ion emitter elements and the plurality of fins is adjustable.

7. The system of claim 1, further comprising:
a controller for controlling the electrical potential between the ion emitter elements and the heat sink fins to vary a rate of airflow through the heat sink.

8. The system of claim 7, wherein the controller is configured to selectively apply the electrical potential in response to a temperature of the heat generating device exceeding a temperature set point.

9. The system of claim 1, wherein the heat generating device includes one or more processors.

10. The system of claim 1, wherein each ion emitter element is a wire or needle.

11. The system of claim 1, wherein the each ion emitter element is a needle that is unsupported at one end.

* * * * *